United States Patent
Gangloff, Jr. et al.

(10) Patent No.: US 12,000,049 B2
(45) Date of Patent: Jun. 4, 2024

(54) ALTERNATING AND CONTINUOUS MICROWAVE FIBER TOW COATING THERMO-CHEMICAL REACTOR FURNACE

(71) Applicant: Raytheon Technologies Corporation, Farmington, CT (US)

(72) Inventors: John J. Gangloff, Jr., Middletown, CT (US); John E. Holowczak, South Windsor, CT (US); Ying She, Rocky Hill, CT (US); Kenneth David Smith, East Longmeadow, MA (US); Haralambos Cordatos, Colchester, CT (US); Gurkan Gok, Milford, CT (US); Zissis A. Dardas, Worcester, MA (US)

(73) Assignee: RTX Corporation, Farmington, CT (US)

( * ) Notice: Subject to any disclaimer, the term of this patent is extended or adjusted under 35 U.S.C. 154(b) by 0 days.

(21) Appl. No.: 17/558,887

(22) Filed: Dec. 22, 2021

(65) Prior Publication Data
US 2023/0193467 A1    Jun. 22, 2023

(51) Int. Cl.
*C23C 16/54* (2006.01)
*C23C 16/511* (2006.01)
*H01J 37/32* (2006.01)

(52) U.S. Cl.
CPC .......... *C23C 16/545* (2013.01); *C23C 16/511* (2013.01); *H01J 37/32192* (2013.01); *H01J 37/3277* (2013.01)

(58) Field of Classification Search
None
See application file for complete search history.

(56) References Cited

U.S. PATENT DOCUMENTS

| 4,497,759 | A | * | 2/1985 | Nakagawa | B29C 55/06 |
| | | | | | 264/479 |
| 5,442,160 | A | * | 8/1995 | Kimrey, Jr. | C04B 35/62868 |
| | | | | | 219/696 |
| 2011/0171399 | A1 | | 7/2011 | Brun et al. | |
| 2015/0144620 | A1 | * | 5/2015 | Wilber | H05B 6/701 |
| | | | | | 219/690 |

(Continued)

FOREIGN PATENT DOCUMENTS

| DE | 19634795 A1 | 3/1998 | |
| DE | 102005049533 B3 | * 1/2007 | .............. F27B 9/062 |

(Continued)

OTHER PUBLICATIONS

Extended European Search Report dated Apr. 26, 2023 for corresponding application EP22212515.5.

*Primary Examiner* — Karla A Moore
(74) *Attorney, Agent, or Firm* — Bachman & LaPointe, P.C.

(57) ABSTRACT

A reactor furnace for coating fiber tow includes an elongate reactor having a fiber tow inlet and a fiber tow outlet; a thermo-chemical reactor section positioned along the elongate reactor; a first microwave source for directing microwave energy along the reactor from a first end of the reactor toward a second end of the reactor; a second microwave source for directing microwave energy along the reactor from the second end of the reactor toward the first end of the reactor; a gas inlet upstream of the thermo-chemical reactor; and a gas outlet downstream of the thermo-chemical reactor.

16 Claims, 1 Drawing Sheet

(56) References Cited

U.S. PATENT DOCUMENTS

2019/0091718 A1* 3/2019 She .................. B29B 15/14
2020/0080003 A1   3/2020 Wang
2021/0062343 A1   3/2021 Delehouze et al.
2021/0245196 A1* 8/2021 Siffer ................ B05D 3/142

FOREIGN PATENT DOCUMENTS

DE    102005049533 B3   1/2007
EP         0406690 A2   1/1991
EP         2343398 A1   7/2011

* cited by examiner

ALTERNATING AND CONTINUOUS MICROWAVE FIBER TOW COATING THERMO-CHEMICAL REACTOR FURNACE

BACKGROUND OF THE DISCLOSURE

The disclosure relates to coating of fiber tow such as structural Ceramic Matrix Composite (CMC) fibers.

Advanced coatings on structural CMC fibers are critical for achieving CMC mechanical toughness and meeting performance requirements in harsh high temperature service environments. Traditional CMC fiber coatings are applied at high temperatures in batch furnaces with specialized tooling that take excessive time, energy, and cost to successfully deposit enough coating.

Inconsistent thermal profiles during conventional coating processes can lead to inconsistent coating quality and ultimately to inconsistent CMC mechanical performance. Inconsistent coating quality can lead to premature coating failure and degrade fiber pull-out behavior from the ceramic matrix during mechanical loading, which is essential for deterring micro-crack propagation and maintaining composite behavior. Long coating batch times are necessary to meet coating quality requirements.

SUMMARY OF THE INVENTION

In one non-limiting configuration, a reactor furnace for coating fiber tow comprises an elongate reactor having a fiber tow inlet and a fiber tow outlet; a thermo-chemical reactor section positioned along the elongate reactor; a first microwave source for directing microwave energy along the reactor from a first end of the reactor toward a second end of the reactor; a second microwave source for directing microwave energy along the reactor from the second end of the reactor toward the first end of the reactor; a gas inlet upstream of the thermo-chemical reactor; and a gas outlet downstream of the thermo-chemical reactor.

In another non-limiting configuration, the reactor furnace further comprises a first circulator downstream of the thermo-chemical reactor, the first circulator positioned to direct microwave energy from the first microwave source to a first termination point.

In still another non-limiting configuration, reactor furnace further comprises a second circulator upstream of the thermo-chemical reactor, the second circulator positioned to direct microwave energy from the second microwave source to a second termination point.

In a further non-limiting configuration, the second circulator isolates the first microwave source from the microwave energy of the second microwave source, and wherein the first circulator isolates the second microwave source from the microwave energy of the first microwave source.

In a still further non-limiting configuration, the reactor furnace further comprises a first fiber spool positioned to feed uncoated fiber to a fiber inlet of the elongate reactor, and a second fiber spool positioned to receive and coil a coated fiber produced in the thermo-chemical reactor.

In another non-limiting configuration, at least one of the first fiber spool and the second fiber spool is electrically grounded.

In still another non-limiting configuration, the reactor furnace further comprises a control unit configured to receive input of temperature in the reactor and to alternate energy between the first microwave source and the second microwave source.

In a further non-limiting configuration, the elongate reactor is a tube having a first and a second end plate, and openings in the first end plate defining an inlet for uncoated fiber in the first end plate, and openings in the second end plate defining an outlet for coated fiber in the second end plate.

In a still further non-limiting configuration, the first and the second end plate each have a plurality of openings whereby multiple fiber tows can be coated simultaneously.

In another non-limiting configuration, the reactor defines an internal space, and further comprises an inert gas environment in the internal space.

In still another non-limiting configuration, the reactor comprises reactor tube materials selected from the group consisting of quartz, graphite and combinations thereof.

In a further non-limiting configuration, the reactor is between about 0.1 and 10 meters long.

In another non-limiting configuration, a method for coating a fiber tow comprises: passing fiber tow through a reactor furnace in the presence of a coating gas; directing a first microwave energy along a length of the fiber tow in one direction; and directing a second microwave energy along the length of the fiber tow in a second direction.

In still another non-limiting configuration, the first microwave energy is directed along the fiber tow in a direction of movement of the fiber tow through the reactor furnace, and wherein the second microwave energy is directed along the fiber tow in a direction opposite to the movement of the fiber tow in through the reactor furnace.

In a further non-limiting configuration, the method further comprises receiving the first microwave energy in a first circulator to direct the first microwave energy away from a source of the second microwave energy; and receiving the second microwave energy in a second circulator to direct the second microwave energy away from the source of the first microwave energy.

In a still further non-limiting configuration, the first circulator directs the first microwave energy to a first terminator, and wherein the second circulator directs the second microwave energy to a second terminator.

In another non-limiting configuration, the method further comprised determining an amount of energy received in each of the first terminator and the second terminator, and adjusting power to a source of the first microwave energy and a source of the second microwave energy based on the amount of energy received.

In still another non-limiting configuration, the method further comprised recovering energy from the first terminator and the second terminator as heat and using the heat to preheat the coating gas.

In a further non-limiting configuration, the method further comprises alternating between directing the first microwave energy along the fiber tow and directing the second microwave energy along the fiber tow.

In a still further non-limiting configuration, the method further comprises feeding fiber tow to the reactor furnace from a first fiber spool, and receiving coated fiber from the reactor furnace onto a second fiber spool, wherein at least one of the first fiber spool and the second fiber spool is electrically grounded.

In another non-limiting configuration, the gas is introduced to the reactor furnace to flow through a thermo-chemical reactor section of the reactor furnace in a gas flow direction, and wherein one of the first microwave energy and the second microwave energy is directed in the same direction as the gas flow direction, and the other of the first microwave energy and the second microwave energy is directed opposite to the gas flow direction.

Other details of the reactor and method are set forth in the following detailed description and the accompanying drawings wherein like reference numerals depict like elements.

BRIEF DESCRIPTION OF THE DRAWINGS

A detailed description of preferred embodiments of the invention follows, with referenced to the attached drawings, wherein.

DETAILED DESCRIPTION

The present disclosure relates to coating of fiber tow such as structural Ceramic Matrix Composite (CMC) fibers wherein fiber tow is coated via Chemical Vapor Deposition (CVD) by being exposed to microwave energy in a reactor in the presence of coating source gas.

In one non-limiting configuration, microwave energy is applied from multiple sources, for example from each end of an elongate reactor. Such a configuration can help to minimize or reduce arcing and uneven heating effects that can be experienced when using only a single mode application of microwave energy.

Figure 1:
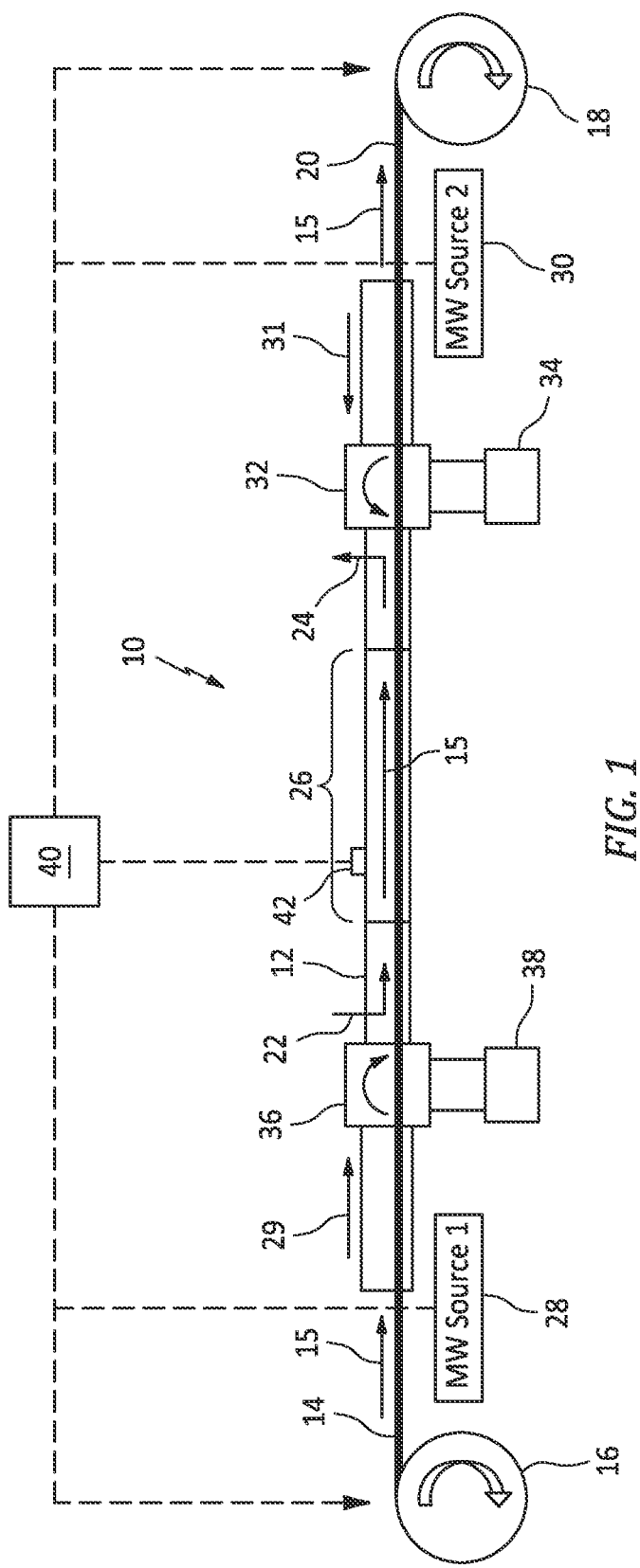
FIG. 1 schematically illustrates one non-limiting embodiment of a microwave thermo-chemical reactor furnace.

Referring to FIG. 1, a reactor furnace 10 is schematically illustrated and has a reactor 12 configured to coat fiber tow in a continuous process. Fiber tow is fed to the reactor as uncoated fiber 14 from a first fiber spool 16. A second fiber spool 18 receives a coated fiber 20 from reactor 12. Movement of the fiber tow through reactor 12 is schematically illustrated at arrows 15.

The coating is a CVD process wherein energy is supplied in the presence of a process gas to deposit the desired coating on the fiber tow as it transits the reactor. Process gas can be introduced into reactor 12, for example as shown at gas inlet 22, and can exit reactor 12 for example from gas outlet 24. In the configuration shown in FIG. 1, gas flows from inlet 22 through a thermo-chemical reactor section 26 to outlet 24 in generally the same direction as fiber tow moves through the reactor 12 from spool 16 to spool 18. In other embodiments, the gas may flow in the opposite direction of the fiber tow, or may be introduced through multiple inlets and/or exit multiple outlets. In one non-limiting configuration, counter-current flow of process gas relative to the movement direction of tow in the reactor provides for enhanced heat and mass transfer, which can enhance the reaction and coating of the fiber tow.

Energy, specifically microwave energy, is introduced to reactor 12 to heat fiber tow as it moves through reactor 12, especially fiber tow in thermo-chemical reactor section 26, to a suitable temperature for deposition of coating materials from the gas in thermo-chemical reactor section. In the illustrated configuration, this energy can be introduced from a first microwave source 28 and a second microwave source 30. As shown schematically, first microwave source 28 can be positioned to direct microwave energy 29 along fiber tow from one end of reactor 12, and second microwave source 30 can be positioned to direct microwave energy 31 along fiber tow from the other end of reactor 12, such that one source directs energy in a direction of movement of fiber tow, and the other source directs energy counter to the direction of movement of fiber tow in reactor 12. It should be appreciated that although the illustrated embodiment has two microwave sources, other embodiments may have more sources and/or pairs of sources, and additional pairs can help, for example, to obtain smoother heating which is beneficial for, among other things, improving quality of the coating on the fiber tow. In addition, one microwave source could be used to direct energy selectively into the reactor from different directions. Further, the microwave source(s) are positioned to introduce microwave energy directly into the reactor and thereby avoid exposing fiber tow to the microwave energy outside the reactor where arcing could be an issue.

In order to prevent energy from microwave source 28 reaching microwave source 30 and vice versa, circulators can be positioned along the reactor to intercept energy coming from the thermo-chemical reactor section 26 and to direct this energy to a termination point. Specifically, a first circulator 32 can be positioned along reactor 12 downstream (as measured by movement of fiber tow) of thermo-chemical reactor section 26, to receive microwave energy coming from the direction of first microwave source 28 and direct such energy to a first termination 34 for disposing of energy reaching termination 34 from microwave source 28. Further, a second circulator 36 can be positioned along reactor 12 upstream (again as measured by movement of fiber tow) of the thermo-chemical reactor section 26 to receive microwave energy coming from the direction of the second microwave source 30 and direct such energy to a second termination 38 for disposing of energy reaching termination 38 from source 30.

Circulators 32, 36 and terminations 34, 38 serve to isolate each of microwave source 28, 30 from receiving energy from the other of microwave source 28, 30.

Circulators 32, 36 are components that can directionally guide microwave energy, particularly transverse to fiber movement direction, and also particularly for energy received only from one direction. It should be noted that circulators can be configured such that energy passing through circulators from the side opposite to the reactor section 26 pass directly through the circulator. Thus, the circulators are advantageously configured to one-directionally redirect microwave energy. Non-limiting examples of suitable circulators include passive, non-reciprocal three or four-port devices that only allow a microwave or radio-frequency signal to exit through the port directly after the one it entered. Such devices can be modified and adapted to the present disclosure, for example to only allow a microwave signal to exit through an offset port, such that the microwave signal is diverted from reaching an opposite microwave source.

In other configurations, for example in high-power implementation, circulators can be replaced with switches such as wageguide switches that can, for example, be mechanically positioned (e.g. motorized switches) in synchronization with source/termination selection. Switches mechanically define the path of microwave energy flow. Such switches and other mechanical approaches to defining the path of microwave energy flow are all considered as used herein to fall under the term "circulators".

Terminations 34, 38 likewise are components that are known to persons skilled in the art, and in this case are devices designed to accept excess energy that is redirected from circulators 32, 36. Terminations 34, 38 could be provided as a single termination, which could accept energy from both circulators. In the broadest sense, the first and second terminations referred to herein could be parts of the same termination, or could be separately implemented, as dictated for example by space and available component size and capacity. As discussed further herein, from a heat balance standpoint, energy accepted at terminations 34, 38 can be used to heat process gas, for example before being introduced through inlet 22.

Thus disclosed is a microwave thermo-chemical reactor furnace with microwave sources on both ends. Sources 28, 30 can in one non-limiting configuration be energized in such a way that the heat and concentration of coating material is consistent through the reactor, or is tailored to provide the most suitable coating conditions where the coating material is in greatest concentration. To this end, the process is well suited to control based upon conditions within the reactor, again with the goal to improve consistency of coating of fiber tow.

A control unit schematically illustrated at 40 can be communicated with a source of conditions such as temperature and energy level within thermo-chemical reactor section 26, and configured to operate either or both of microwave source 28 and microwave source 30 in order to produce desired uniform heating of fiber tow in the reactor section 26, which leads to enhanced coating quality and reduced coating time. Control unit 40 is shown schematically communicated with one or more sensors 42 in thermo chemical reactor section 26. Additional and different types of sensors could also be utilized, for example to measure temperature of the tow in different locations, to measure gas concentration at different locations, to measure energy received in terminations 34, 38, and the like. Control unit 40 can also be communicated with each of microwave source 28 and microwave source 30, such that control unit can be configured to alternatingly and/or simultaneously operate sources 28, 30, for example to maintain uniform heating of fiber tow in the reactor and especially in reactor section 26. Control unit 40 can also be communicated with drives of spools 16, 18 such that speed of fiber tow passing through the reactor section 26, or residence time, can be adjusted. Configured in this manner, good coating conditions can be produced within reactor section 26.

It should be appreciated that control unit 40 can be configured to operate microwave sources 28, 30 asynchronously since the fiber tow moving through the reactor is continuously heated as it traverses the length of the reactor. Thus, less energy may be needed at the downstream end, in the configuration illustrated in FIG. 1, from the downstream microwave source.

Controlling cycling of microwave sources 28, 30 can smooth out formed hot spots near process gas inlets and throughout the heated fiber length with double-ended microwave power sources and alternating power inputs.

Fiber tow to be coated can suitably be ceramic fiber tow such as fiber tow made of silicon carbide, carbon, oxide and combinations thereof. Other materials would be readily apparent to persons having ordinary skill in the art, and such materials can also form CMC fiber tow to be coated as disclosed herein.

The chemical reaction uses process heating to form a ceramic coating on the fiber tow surfaces. Typical coatings include, but is not limited to, coatings of material such as pyrolytic carbon, silicon carbide, boron nitride and the like.

Coating gasses can be any gas from which a Chemical Vapor Deposition (CVD) can be accomplished and containing the desired coating materials. Non-limiting examples of suitable materials are as described above, namely pyrolytic carbon, silicon carbide, boron nitride and the like, which can be provided in gaseous precursor form such that CVD conditions lead to the desired coating.

Microwave sources can be any known sources of microwave energy, and can include commercial off the shelf (COTS) options, and others. There are numerous suppliers of COTS microwave system components, and these components use magnetrons to generate microwave energy. Of course, other sources of microwave energy can be utilized within the broad scope of this disclosure. In one configuration, these sources are capable of emitting microwave energy in a range of between 915 MHz and 2450 MHz.

Fiber tows to be coated can be any of numerous compositions, but one non-limiting example is CMC fiber tows which are good candidates for coating and use in numerous applications. Non-limiting examples of such applications include high temperature jet engine components, gas turbine components, thermal management components and the like.

Figure 2:
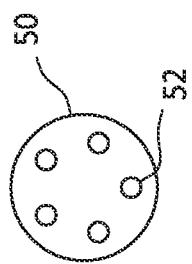
FIG. 2 schematically illustrates an end plate of a microwave thermo-chemical reactor furnace.

As indicated above, reactor 12 can be provided as an elongate housing or chamber configured to receive fiber tow passed through a plate at one end, through the interior of the tube, and out of a plate at the other end. Fiber tows can pass through these plates via one or more openings in the plates. FIG. 2 shows a schematic of an end plate 50 having a plurality of openings 52 configured to allow fibers to pass. Further, with a plurality of openings in the end plates, it should be appreciated that the coating process disclosed herein can be conducted with a plurality of fiber tows, thereby improving process efficiency. It should also be appreciated that similar structure could be utilized for end plate 50 to be used at the tow inlet side and also at the tow outlet side.

A reactor 12 for use as disclosed herein can have any suitable dimensions in terms of length, diameter, and length of reactor zone. In this regard, in one configuration the reactor can have a length of between about 0.1 and about 10 meters. Further, the length of reactor section 26 can be between about 0.1 and about 10 meters, and in one embodiment this length can be roughly centered in the overall length of the reactor.

Coating can be carried out with fiber tow being passed through reactor 12 at a speed of between 0.0005 m/s and 50 m/s, depending upon the length and temperature profile of the reaction or hot zone, the reactant gas concentration(s) and desired coating thickness, all as would be understood by a person having ordinary skill in the art. Within these parameters, the fiber tow can have a residence time within reactor section 26 of between 0.2 s and 200 s.

When using typical CVD gases and fiber tows, temperature of the tow can advantageously be heated to suitable CVD temperature over approximately 80% of the length of reactor section 26, with 10% length at the inlet and 10% length at the outlet being used to ramp up or down from the process temperature. In this manner a good quality coating can be obtained.

The microwave heating zones can be tuned such that the heating occurs where the concentration of coating chemical reactants is more favorable for fiber tow coating along the fiber length of the reactor. Use of microwave power advantageously allows for rapid heating from a center core of the fiber tow outward towards the fiber tow surfaces, rather than conventional heating that heats the fiber tow surfaces first and then the center core. This heating profile is unique to microwave heating and can provide a more rapid heating of the fiber tow as well as a more uniform heating that can lead to a more uniform fiber coating throughout the interior and exteriors of the ceramic fiber tow.

As set forth above, terminations 34, 38, respectively, terminate excess power from microwave sources 28, 30 after the source energy passes through the reactor section 26. The main role of terminations is to protect the microwave sources from the incoming energy, if any. Alternative approaches such as using MW switches configured through control unit 40 as set forth above are possible. Further, reactor furnace 10 can be configured to be single-mode microwave or multi-mode microwave depending on the chosen fiber material properties.

The reactor tube 12 can be made of materials selected to have low dielectric constant and low microwave loss for better thermal efficiency in heating the fiber.

To mitigate microwave induced arcing, process inert gas can be introduced into reactor 12, and can be ionized. Since microwave heating can lead to electrical arcing, primarily due to the buildup of electrical charge at free fiber ends protruding outward from the fiber tow surfaces, the inert gas environment, for example argon or nitrogen, helps mitigate arcing risk by deterring ionization of the reactor environment.

In further efforts to reduce risk of arcing, spools 16, 18 can be electrically grounded rolling elements (e.g., pulleys or specially shaped rollers) that allow for the fiber tow to move freely and continuously, yet also provide a conductive pathway to mitigate the buildup of electrical charge and mitigate arcing risk.

In addition, electrically grounded rolling elements may help compact the passing fiber tow to some degree and mechanically compact free fiber ends into the main body of the fiber tow, which can help mitigate propensity for free fiber ends and thus reduce arcing risk. The electrically grounded rolling elements or spools 16, 18 can be designed to compact different fiber tow architectures such that free fiber ends are compacted into the tow, yet the tow is porous enough for coating reactant gasses to pass through and evenly deposit coating materials into and around the fiber tow surface.

In this regard, a smooth fiber is preferred to improve the mechanical performance of the CMC (e.g., smooth fibers yield higher composite strain to failure).

The reactor 10 disclosed herein can feed coating chemical reactants co-current with the movement of fiber tow in the reactor, as illustrated in FIG. 1. Alternatively, the chemical reactants, or process gas, can be fed in a counter-current manner for better heat transfer. That is, gas can be introduced to the reactor at an inlet and flow to an outlet, and the flow direction can be co-current or counter-current to the movement of fiber tows being coated in the reactor. Further, in some embodiments there may be multiple gas flow paths defined by multiple gas inlets and/or outlets. In the counter-current flow configuration, heat and mass transfer are enhanced, as is the reaction.

Microwave heating can be conducted back and forth from one source to the other due to the two-way and alternating microwave source architecture disclosed herein.

Control unit 40 can also be configured to generate asymmetric heating which may help compensate depletion of coating chemical reactants along the flow length of fiber tow through reactor 12 and especially through reactor section 26. Specifically, temperature within reactor 12 can be monitored using control unit 40 and sensors 42, and gas concentration in reactor 12 can also be measured or otherwise known in advance or determined, and energy supplied where it is most beneficial based upon coating gas concentration.

Use of microwave process heating can provide energy efficiency and cost savings benefits. For example, use of microwave heating can be sourced from renewable energy-based electricity and avoid the use of fossil fuel-based process heating. Also, the rapid heat up that can be accomplished with microwave-based energy can minimize the thermal residence time and the thermal losses associated with traditional fossil-fuel based process heating pathways (e.g., heating the target material directly versus heating the ambient reactor walls and overcoming wall thermal losses).

In operation, a coating process can be started by introducing an inert atmosphere or environment into reactor 12 while optionally preliminarily heating reactor 12. A leader for fiber tow can be fed through the reactor to connect from spool 16 to spool 18, and a flow of process gas can be introduced through gas inlet 22. When conditions are correct to begin coating, energy can be provided to one, the other, or both of the microwave sources. This can be done while monitoring temperature of the fiber tow at various locations within reactor 12 and especially within reactor section 26. Power to the microwave sources 28, 30 can then be controlled by control unit 40 based upon the sensed conditions within reactor 12 in order to maintain substantially uniform heating of the tow in the reactor while coating occurs. Fiber tow is initially fed through reactor 12 at an initial feed rate or residence time, and this rate or time can be adjusted based upon measurements taken with sensors 42 or otherwise, and acted upon with control unit 40.

Energy received at the terminations can be monitored to adjust efficiency of the process. For example, if excessive energy is received at the termination, then the microwave source directing energy that arrives at that termination can be operated at a lower energy level. Further, as outlined above, the energy received at the termination can be converted to heat energy and used to preheat the process gas, which helps with the overall process efficiency as well as providing an energy balanced process.

One or more embodiments of the present disclosure have been described. Nevertheless, it will be understood that various modifications may be made without departing from the spirit and scope of the invention. For example, different coating alloys and coating methods could be used, and parts or components from other areas of gas turbine engines, and other devices altogether, could also benefit from the repair coating method disclosed herein.

Accordingly, other embodiments are within the scope of the following claims.

What is claimed is:
1. A reactor furnace for coating fiber tow, comprising:
an elongate reactor having a fiber tow inlet and a fiber tow outlet;
a thermo-chemical reactor section positioned along the elongate reactor;
a first microwave source configured to direct microwave energy along the thermo-chemical reactor section in a direction from a first end of the elongate reactor toward a second end of the elongate reactor;
a second microwave source configured to direct microwave energy along the thermo-chemical reactor section in a direction from the second end of the elongate reactor toward the first end of the elongate reactor;
a gas inlet upstream of the thermo-chemical reactor section with respect to a direction of feed of fiber tow from the fiber tow inlet to the fiber tow outlet; and
a gas outlet downstream of the thermo-chemical reactor section with respect to the direction of feed of fiber tow from the fiber tow inlet to the fiber tow outlet;
a first circulator downstream of the thermo-chemical reactor section, the first circulator positioned to direct microwave energy from the first microwave source to a first termination point; and a second circulator upstream of the thermo-chemical reactor section, the second circulator positioned to direct microwave energy from the second microwave source to a second termination point; wherein the second circulator isolates the first microwave source from the microwave energy of the second microwave source, and wherein the first circulator isolates the second microwave source from the microwave energy of the first microwave source.

2. The reactor furnace of claim 1, further comprising a first fiber spool positioned to feed uncoated fiber to the fiber tow inlet of the elongate reactor, and a second fiber spool positioned to receive and coil a coated fiber produced in the thermo-chemical reactor.

3. The reactor furnace of claim 2, wherein at least one of the first fiber spool and the second fiber spool is electrically grounded.

4. The reactor furnace of claim 1, further comprising a control unit configured to receive input of temperature in the reactor and to alternate energy between the first microwave source and the second microwave source.

5. The reactor furnace of claim 1, wherein the elongate reactor is a tube having a first end plate and a second end plate, and at least one opening in the first end plate defining an inlet for uncoated fiber in the first end plate, and at least one opening in the second end plate defining an outlet for coated fiber in the second end plate.

6. The reactor furnace of claim 5, wherein the first end plate and the second end plate each have a plurality of openings whereby multiple fiber tows can be coated simultaneously.

7. The reactor furnace of claim 1, wherein the elongate reactor defines an internal space, and further comprising an inert gas environment in the internal space.

8. The reactor furnace of claim 1, wherein the elongate reactor comprises reactor tube materials selected from the group consisting of quartz, graphite and combinations thereof.

9. The reactor furnace of claim 1, wherein the elongate reactor is between about 0.1 and 10 meters long.

10. A method for coating a fiber tow, comprising:
passing the fiber tow through the reactor furnace according to claim 1 in the presence of a coating gas; and
directing microwave energy from the first microwave source along a length of the fiber tow in the direction from the first end toward the second end; and
directing microwave energy from the second microwave source along the length of the fiber tow in the direction from the second end toward the first end;
receiving the microwave energy from the first microwave energy source in the first circulator to direct the microwave energy from the first microwave source away from the second microwave source; and receiving the microwave energy from the second microwave source in the second circulator to direct the microwave energy from the second microwave source away from the first microwave source, wherein the first circulator directs the microwave energy from the first microwave source to the first termination point, and wherein the second circulator directs the microwave energy from the second microwave source to the second termination point.

11. The method of claim 10, wherein the microwave energy from the first microwave source is directed along the fiber tow in the direction of feed of the fiber tow, and wherein the microwave energy from the second microwave source is directed along the fiber tow in a direction opposite to the direction of feed.

12. The method of claim 10, further comprising determining an amount of energy received in each of the first termination point and the second termination point, and adjusting power to the first microwave source and the second microwave source based on the amount of energy received.

13. The method of claim 10, further comprising recovering energy from the first termination point and the second termination point as heat and using the heat to preheat the coating gas.

14. The method of claim 10, further comprising alternating between directing the microwave energy from the first microwave source along the fiber tow and directing the microwave energy from the second microwave source along the fiber tow.

15. The method of claim 10, further comprising feeding the fiber tow to the reactor furnace from a first fiber spool, and receiving coated fiber from the reactor furnace onto a second fiber spool, wherein at least one of the first fiber spool and the second fiber spool is electrically grounded.

16. The method of claim 10, wherein gas is introduced to the reactor furnace to flow through the thermo-chemical reactor section of the reactor furnace in a gas flow direction, and wherein one of the microwave energy from the first microwave source and the microwave energy from the second microwave source is directed in the same direction as the gas flow direction, and the other of the microwave energy from the first microwave source and the microwave energy from the second microwave source is directed opposite to the gas flow direction.

* * * * *